US012183830B2

(12) United States Patent
Yamaguchi

(10) Patent No.: US 12,183,830 B2
(45) Date of Patent: Dec. 31, 2024

(54) DISPLAY DEVICE AND MANUFACTURING METHOD THEREFOR

(71) Applicant: Japan Display Inc., Tokyo (JP)

(72) Inventor: Yohei Yamaguchi, Tokyo (JP)

(73) Assignee: Japan Display Inc., Tokyo (JP)

( * ) Notice: Subject to any disclaimer, the term of this patent is extended or adjusted under 35 U.S.C. 154(b) by 320 days.

(21) Appl. No.: 17/584,481

(22) Filed: Jan. 26, 2022

(65) Prior Publication Data

US 2022/0149204 A1 May 12, 2022

Related U.S. Application Data

(63) Continuation of application No. PCT/JP2020/027486, filed on Jul. 15, 2020.

(30) Foreign Application Priority Data

Aug. 6, 2019 (JP) ................................. 2019-144765

(51) Int. Cl.
  *H01L 29/786* (2006.01)
  *H01L 29/66* (2006.01)
(52) U.S. Cl.
  CPC .... *H01L 29/7869* (2013.01); *H01L 29/66742* (2013.01); *H01L 29/78696* (2013.01)
(58) Field of Classification Search
  CPC ........... H01L 29/7869; H01L 29/66742; H01L 29/78696; H01L 27/1225; H01L 27/124;
  (Continued)

(56) References Cited

U.S. PATENT DOCUMENTS

| 2010/0025678 A1* | 2/2010 | Yamazaki | ............... H01L 21/46 257/E21.414 |
| 2011/0031493 A1* | 2/2011 | Yamazaki | ........... H01L 27/1251 438/23 |

(Continued)

FOREIGN PATENT DOCUMENTS

| JP | 2006-261538 A | 9/2006 |
| JP | 2011-054957 A | 3/2011 |

(Continued)

OTHER PUBLICATIONS

International Search Report mailed on Oct. 6, 2020, for the PCT Application No. PCT/JP2020/027486, with English machine translation.

(Continued)

*Primary Examiner* — Marcos D. Pizarro
*Assistant Examiner* — Tiberiu Dan Onuta
(74) *Attorney, Agent, or Firm* — Michael Best & Friedrich LLP

(57) ABSTRACT

A display device includes a metal layer composed of multiple layers including a lowermost layer lower in an ionization tendency than a middle layer, the lowermost layer being in contact with and on the oxide semiconductor layer. Each channel region is interposed between a corresponding one of the first electrodes and a corresponding one of the second electrodes, constituting a corresponding one of the thin film transistors. The oxide semiconductor layer is continuous between a pair of channel regions included in an adjacent pair of thin film transistors. The metal layer is continuous between a pair of first electrodes included in the adjacent pair of thin film transistors.

6 Claims, 11 Drawing Sheets

(58) Field of Classification Search
CPC ............ H01L 27/1244; H01L 27/1259; G02F 1/1368; G09F 9/00; G09F 9/30; H10K 59/12; H10K 59/1213; H10K 59/131

See application file for complete search history.

(56) References Cited

U.S. PATENT DOCUMENTS

| | | |
|---|---|---|
| 2011/0175082 A1 | 7/2011 | Kim et al. |
| 2013/0302924 A1 | 11/2013 | Yamazaki et al. |
| 2014/0042443 A1* | 2/2014 | Yamazaki ........... H01L 27/1225 257/296 |
| 2015/0162361 A1 | 6/2015 | Wang |
| 2016/0020331 A1 | 1/2016 | Kim et al. |
| 2016/0149047 A1 | 5/2016 | Watakabe et al. |
| 2017/0005118 A1 | 1/2017 | Yamazaki et al. |

FOREIGN PATENT DOCUMENTS

| | | |
|---|---|---|
| JP | 2011-146713 A | 7/2011 |
| JP | 2012-104639 A | 5/2012 |
| JP | 2016-100521 A | 5/2016 |

OTHER PUBLICATIONS

German Office Action dated Nov. 11, 2022, for the corresponding German Patent Application No. 11 2020 003 005.9, with machine English translation.

* cited by examiner

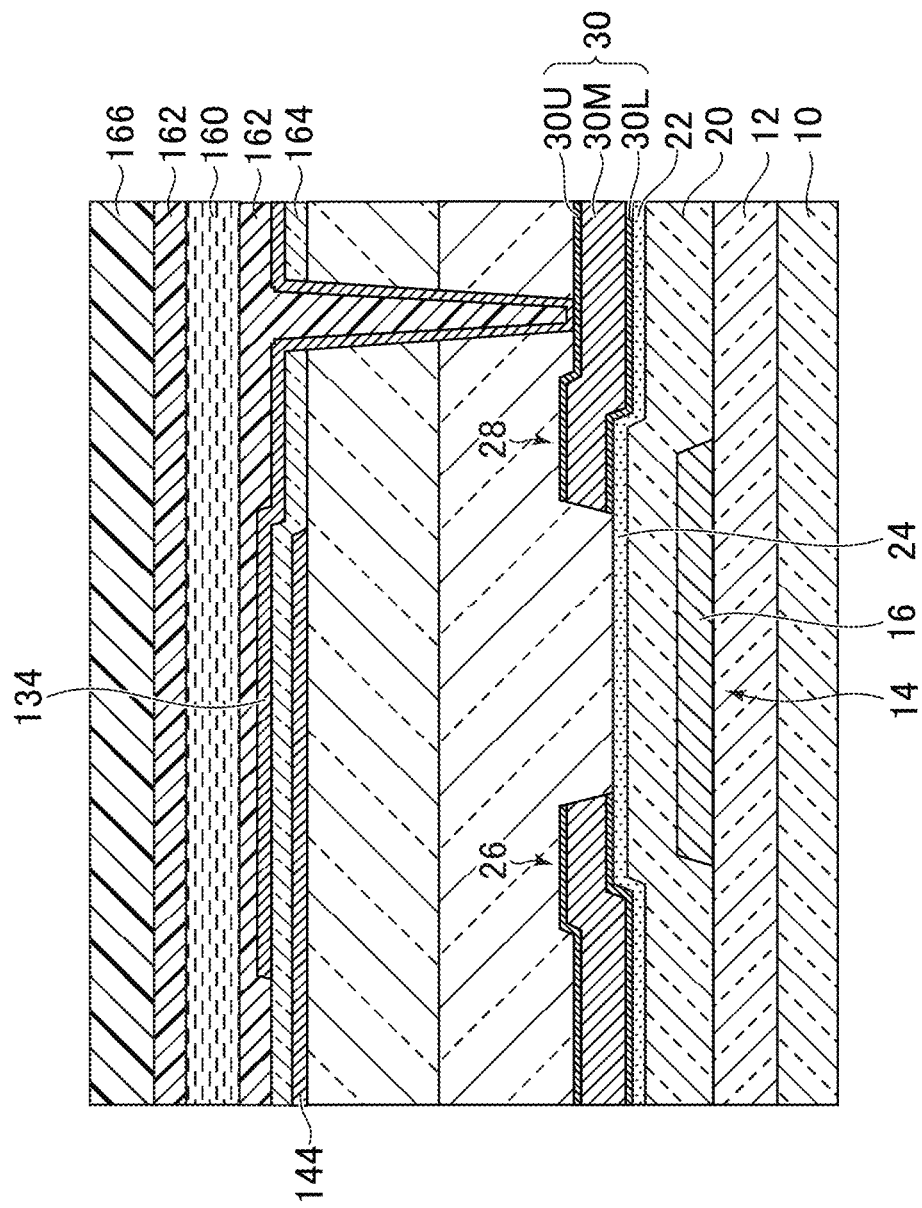

DISPLAY DEVICE AND MANUFACTURING METHOD THEREFOR

CROSS-REFERENCE TO RELATED APPLICATION

This application is a continuation application of International Application PCT/JP2020/027486 filed on Jul. 15 2020, which claims priority from Japanese patent application JP2019-144765 filed on Aug. 6, 2019. The contents of these applications are incorporated herein by reference in their entirety.

BACKGROUND

1. Field

This disclosure relates to a display device and a method of manufacturing the same.

2. Description of the Related Art

Oxide semiconductor may be used for a thin film transistor (TFT), instead of low-temperature polysilicon that is difficult to suppress a leakage current due to a high off current (JP 2016-100521A and JP 2012-104639A). In a bottom gate type TFT, a drain/source electrode is formed beyond an end of an oxide semiconductor layer constituting a channel.

The oxide semiconductor layer may have a steep end face, making it likely to cause a break of the drain/source electrode.

The drain/source electrode may be composed of multiple layers and have its lowermost layer cut, making its middle layer thereon be in contact with the oxide semiconductor layer. When the lowermost layer is made from titanium, molybdenum, or nickel, and the middle layer is made from aluminum, a threshold voltage drop (depletion) may occur due to reduction of the oxide semiconductor layer by the aluminum.

SUMMARY

This disclosure aims at suppressing a characteristic change of a transistor.

A display device with a plurality of thin film transistors includes: a plurality of gate electrodes; a gate insulating layer covering the plurality of gate electrodes; an oxide semiconductor layer on the gate insulating layer; and a metal layer composed of multiple layers including a lowermost layer and a middle layer, the lowermost layer being lower in an ionization tendency than the middle layer, the lowermost layer being in contact with and on the oxide semiconductor layer. The oxide semiconductor layer includes a plurality of channel regions, the metal layer includes a plurality of first electrodes and a plurality of second electrodes, each of the plurality of channel regions is interposed between a corresponding one of the plurality of first electrodes and a corresponding one of the plurality of second electrodes, constituting a corresponding one of the plurality of thin film transistors, the oxide semiconductor layer is continuous between a pair of the plurality of channel regions included in an adjacent pair of the plurality of thin film transistors, and the metal layer is continuous between a pair of the plurality of first electrodes included in the adjacent pair of the plurality of thin film transistors.

The oxide semiconductor layer is continuous between the pair of channel regions included in the adjacent pair of thin film transistors. That is, under the metal layer, there is no end of the oxide semiconductor layer. Therefore, no break is formed in the metal layer, making it possible to suppress the characteristic change of the transistors.

A method for manufacturing a display device with a plurality of thin film transistors includes: forming a plurality of gate electrodes; forming a gate insulating layer to cover the plurality of gate electrodes; forming an oxide semiconductor layer on the gate insulating layer; forming a metal layer to have multiple layers including a lowermost layer and a middle layer, the lowermost layer being lower in an ionization tendency than the middle layer, the lowermost layer being in contact with and on the oxide semiconductor layer; shaping the metal layer into a form including a plurality of first electrodes and a plurality of second electrodes; and after shaping the metal layer, shaping the oxide semiconductor layer into a form including a plurality of channel regions. Each of the plurality of channel regions is interposed between a corresponding one of the plurality of first electrodes and a corresponding one of the plurality of second electrodes, constituting a corresponding one of the plurality of thin film transistors, the form of the oxide semiconductor layer is shaped to be continuous between a pair of the plurality of channel regions included in an adjacent pair of the plurality of thin film transistors, and the form of the metal layer is shaped to be continuous between a pair of the plurality of first electrodes included in the adjacent pair of the plurality of thin film transistors.

The oxide semiconductor layer is continuous between the pair of channel regions included in the adjacent pair of thin film transistors. That is, under the metal layer, there is no end of the oxide semiconductor layer. Therefore, no break is formed in the metal layer, making it possible to suppress the characteristic change of the transistors.

BRIEF DESCRIPTION OF THE DRAWINGS

FIG. 11 is a cross-sectional view of a display device according to a modification.

DETAILED DESCRIPTION

Figure 1:
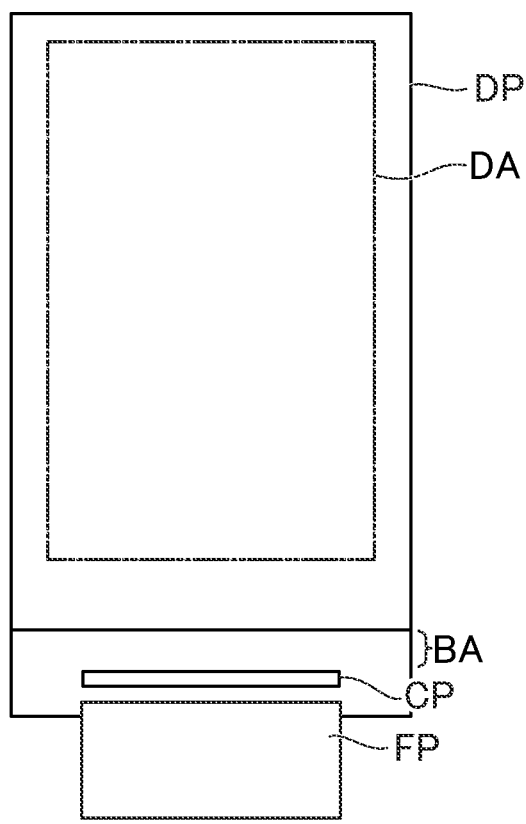
FIG. 1 is a plan view of a display device according to an embodiment.

Embodiments of the present invention will be described below with reference to the drawings. However, the present invention can be implemented in various modes without departing from the gist thereof, and should not be construed as being limited to the description of the following exemplary embodiments.

For the sake of clarity of description, the drawings may be schematically represented with respect to widths, thicknesses, shapes, and the like of the respective portions compared with actual embodiments, but are merely an example and do not limit the interpretation of the present invention. In this specification and each of the drawings, elements having the same functions as those described with reference to the preceding drawings are denoted by the same reference numerals, and a duplicate description thereof may be omitted.

Furthermore, in the detailed description of the present invention, when defining the positional relationship between one component and another, the terms "above" and "below" include not only the case of being positioned directly above or below one component, but also the case of interposing another component therebetween, unless otherwise specified.

FIG. 1 is a plan view of a display device according to an embodiment. The display device includes a display DP. The display DP, when it is flexible, is foldable at a bending area BA outside a display area DA where images are displayed. An integrated circuit chip CP configured to drive elements for displaying the images is mounted on the display DP. A flexible printed circuit board FP is connected to the display DP outside the display area DA. The display device is, for example, an organic electroluminescent display device. In the display area DA, for example, some pixels (sub-pixels) in colors consisting of red, green, and blue are combined to display a full-color image. The display device may be an electronic paper.

Figure 2:
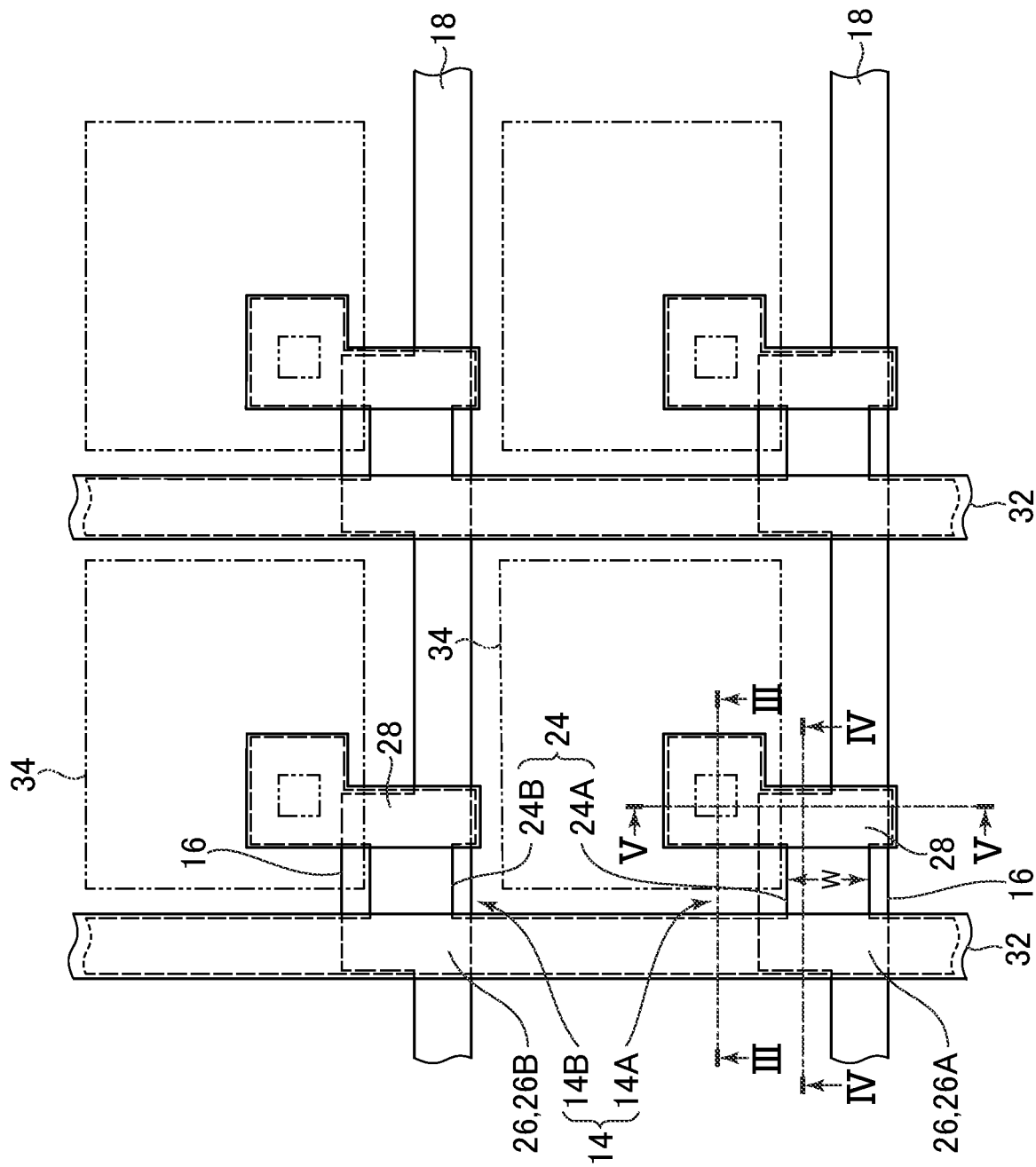
FIG. 2 is a plan view of a device structure of each pixel.
Figure 3:
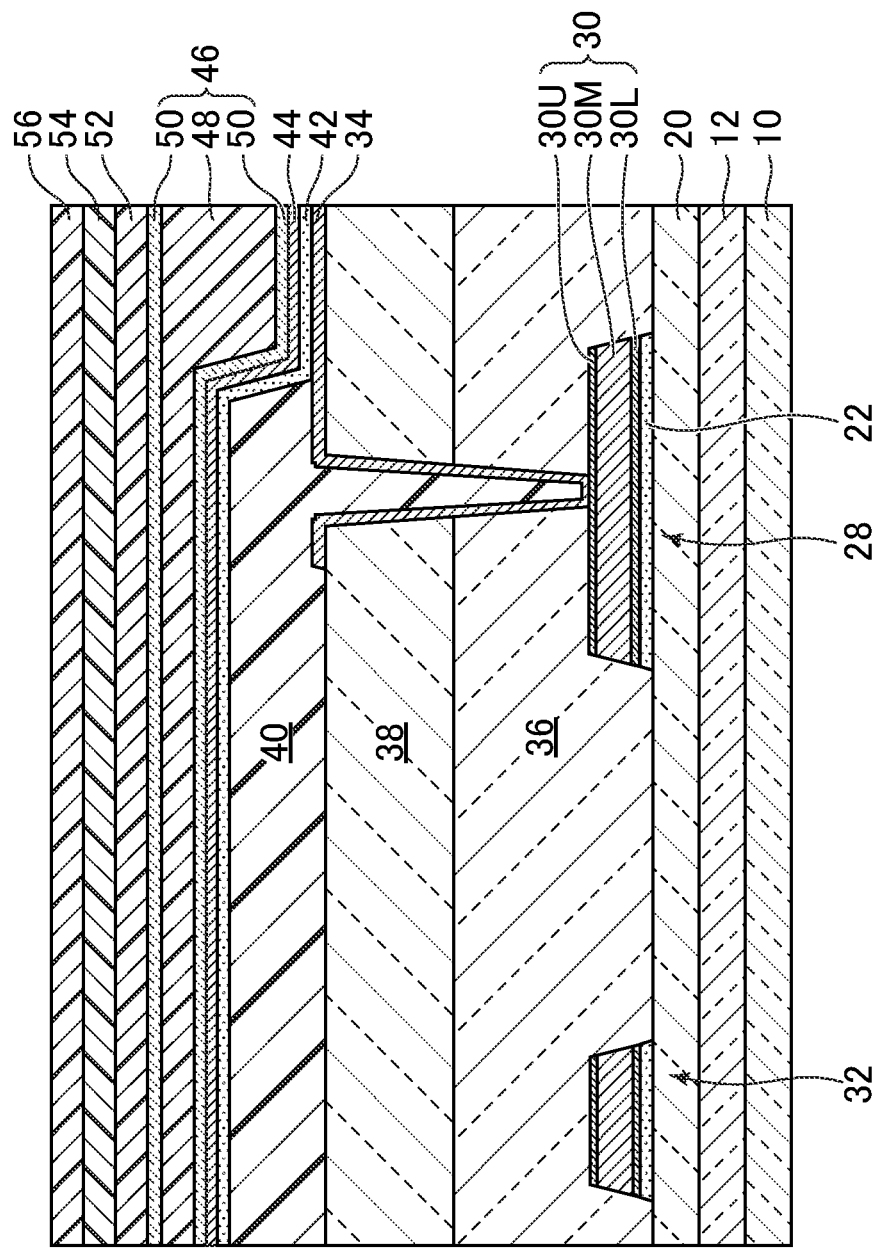
FIG. 3 is a III-III cross-sectional view of the structure shown in FIG. 2.
Figure 4:
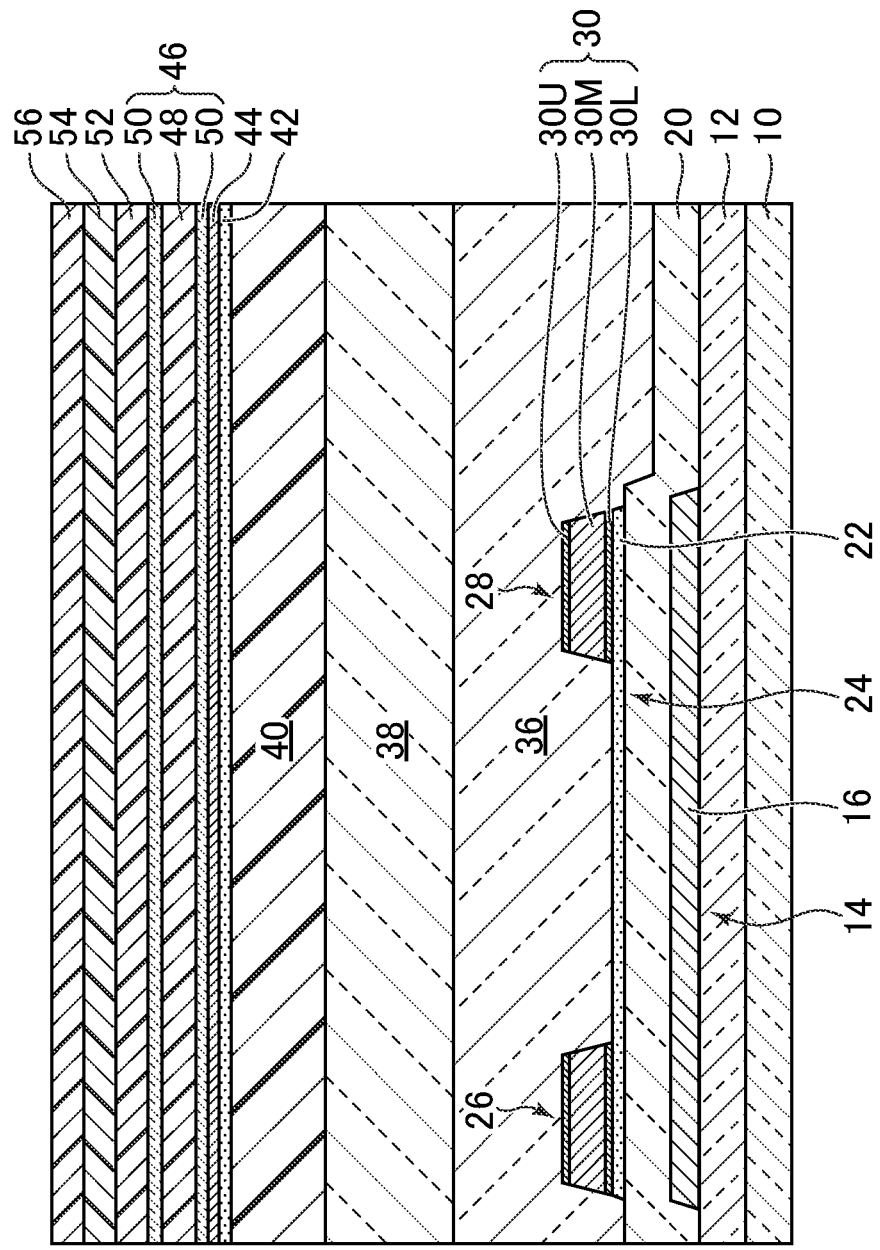
FIG. 4 is a IV-IV cross-sectional view of the structure shown in FIG. 2.
Figure 5:
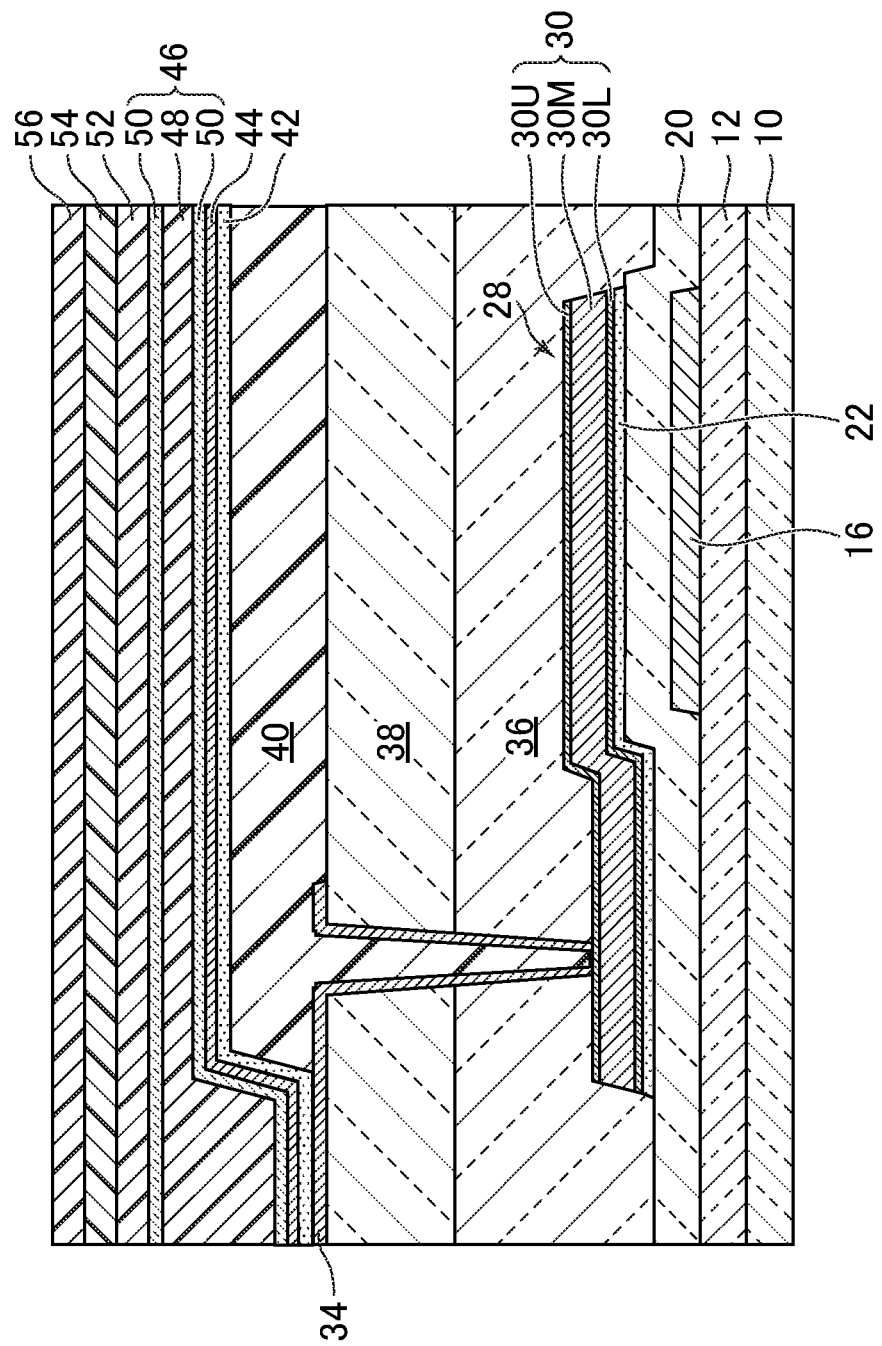
FIG. 5 is a V-V cross-sectional view of the structure shown in FIG. 2.

FIG. 2 is a plan view of a device structure of each pixel. FIG. 3 is a III-III cross-sectional view of the structure shown in FIG. 2. FIG. 4 is a IV-IV cross-sectional view of the structure shown in FIG. 2. FIG. 5 is a V-V cross-sectional view of the structure shown in FIG. 2.

The substrate 10 may be made of glass, or is made of a resin such as polyimide if flexibility is required. An undercoat layer 12 is laminated on the substrate 10. The undercoat layer 12 is made of an insulating film such as a silicon oxide film, and may be multiple layers or a single layer.

The display device is equipped with a plurality of thin film transistors 14 of a bottom gate type. The plurality of thin film transistors 14 each include a plurality of gate electrodes 16. Each of the plurality of gate electrodes 16 is integrated with a corresponding one of a plurality of scan lines 18. The display device has a gate insulating layer 20 covering the plurality of gate electrodes 16. The gate insulating layer 20 is a silicon oxide film.

The thin film transistor 14 has an oxide semiconductor layer 22. The oxide semiconductor layer 22 is made of, for example, IGZO (Indium Gallium Zinc Oxide) or IZO (Indium Zinc Oxide). The oxide semiconductor layer 22 rests on the gate insulating layer 20. Above the gate electrode 16 is the oxide semiconductor layer 22. The thin film transistor 14 has the oxide semiconductor layer 22 as a channel region 24, enabling reduction of current variation and keeping an off-current very low.

The oxide semiconductor layer 22 includes a plurality of channel regions 24. Each of the plurality of channel regions 24 is interposed between a corresponding one of the plurality of first electrodes 26 and a corresponding one of the plurality of second electrodes 28, constituting a corresponding one of the plurality of thin film transistors 14. The oxide semiconductor layer 22 is continuous between a pair of channel regions 24A, 24B included in an adjacent pair of thin film transistor 14A, 14B.

The display device has a metal layer 30. The metal layer 30 is composed of multiple layers. A lowermost layer 30L is mounted on and in contact with the oxide semiconductor layer 22. The lowermost layer 30L is lower in an ionization tendency than a middle layer 30M. As an example, the lowermost layer 30L is made of titanium. The middle layer 30M is made of aluminum. The middle layer 30M is between the lowermost layer 30L and the uppermost layer 30U. The uppermost layer 30U is made of the same material as the lowermost layer 30L.

Here, the lowermost layer 30L of the metal layer 30 has a film thickness of 50 nm, the middle layer 30M has a film thickness of 400 nm, and the oxide semiconductor layer 22 has a film thickness of about 75 nm.

The metal layer 30 includes a plurality of first electrodes 26. Each of the plurality of first electrodes 26 is integrated with a corresponding one of a plurality of video signal lines 32. The metal layer 30 is continuous between a pair of first electrodes 26A, 26B included in an adjacent pair of thin film transistors 14A, 14B. The metal layer 30 includes a plurality of second electrodes 28. Each of the plurality of second electrodes 28 is connected to a corresponding one of a plurality of pixel electrodes 34.

According to the present embodiment, the oxide semiconductor layer 22 is continuous between the pair of channel regions 24A, 24B included in the adjacent pair of thin film transistors 14A, 14B. That is, under the metal layer 30, there is no end of the oxide semiconductor layer 22. Therefore, no break is formed in the metal layer 30, making it possible to suppress the characteristic change of the thin film transistor 14. As described above, when the film thickness of the lowermost layer 30L is less than the film thickness of the oxide semiconductor layer 22, if the end of the oxide semiconductor layer 22 exists under the metal layer 30, a break is likely to be formed, whereby the configuration of this embodiment is effective. Needless to say, even when the film thickness of the lowermost layer 30L is greater than the film thickness of the oxide semiconductor layer 22, the effectiveness is the same due to a possibility of the break.

Each of the plurality of thin film transistors 14 includes the corresponding first electrode 26 and the corresponding second electrode 28 as a drain electrode and a source electrode. The thin film transistor 14 has a channel width W (width of the channel region 24) smaller than either of the widths of the drain electrode and the source electrode.

A passivation layer 36 is on the metal layer 30. The passivation layer 36 is a silicon oxide film and a silicon nitride film. The passivation layer 36 is covered with a planarization layer 38. The planarization layer 38 is formed from a resin such as photosensitive acrylic due to superiority in surface flatness to an inorganic insulating material possibly formed by CVD (Chemical Vapor Deposition).

A plurality of pixel electrodes 34 are arranged on the planarization layer 38. The pixel electrode 34 is formed as a reflective electrode. The pixel electrode 34 penetrates the planarization layer 38 and the passivation layer 36 to be connected to the second electrode 28.

On the planarization layer 38 and on a periphery of the pixel electrode 34, an insulating layer 40 is formed as a partition wall called a bank (rib) between adjacent pixel regions. The photosensitive acrylic may be used for the insulating layer 40 just like the planarization layer 38. The insulating layer 40 has an opening to expose a surface of the pixel electrode 34 as a light emitting region, and the opening should have an edge in a gently tapered shape. A steep shape of the opening at its edge would cause poor coverage of the electroluminescent layer 42 formed thereon.

The electroluminescent layer 42, which is made of organic materials, for example, is laminated on the pixel electrode 34. The electroluminescent layer 42 has a structure in which a hole injection transport layer, a light emitting layer, and an electron injection transport layer are laminated in order from the pixel electrode 34 side. For example, a plurality of light emitting layers are separated corresponding to the plurality of pixel electrodes 34, and at least one layer of the hole injection and transport layer and at least one layer of the electron injection transport layer continuously overlap with the plurality of light emitting layers.

There is a counter electrode 44 on the electroluminescent layer 42. Because of a top emission structure being employed here, the counter electrode 44 is transparent. For example, an Mg layer and an Ag layer are formed as a thin film enough to pass light emitted from the electroluminescent layer 42. According to the order of formation of the electroluminescent layer 42 described above, the pixel electrode 34 is an anode, and the counter electrode 44 is a cathode. A light emitting element is composed of the plurality of pixel electrodes 34, the counter electrode 44, and the electroluminescent layer 42 between a central portion of each of the plurality of pixel electrodes 34 and the counter electrode 44.

There is a sealing layer 46 on the counter electrode 44. The sealing layer 46 has a function of preventing external moisture from entering the electroluminescent layer 42, and is required to have a high gas barrier property. The sealing layer 46 has a laminated structure of an organic film 48 and a pair of inorganic films 50 (e.g., silicon nitride films) sandwiching it above and below. The pair of inorganic films 50 overlap with and are in contact with each other around the organic film 48. A silicon oxide film or an amorphous silicon layer may be provided between the inorganic film 50 and the organic films 48 partially for improving adhesion. A reinforcing organic film 52 is laminated on the sealing layer 46. A polarizing plate 56 (e.g., circular polarizing plate) is attached to the reinforcing organic film 52 with an adhesive layer 54 interposed therebetween.

Figure 6:
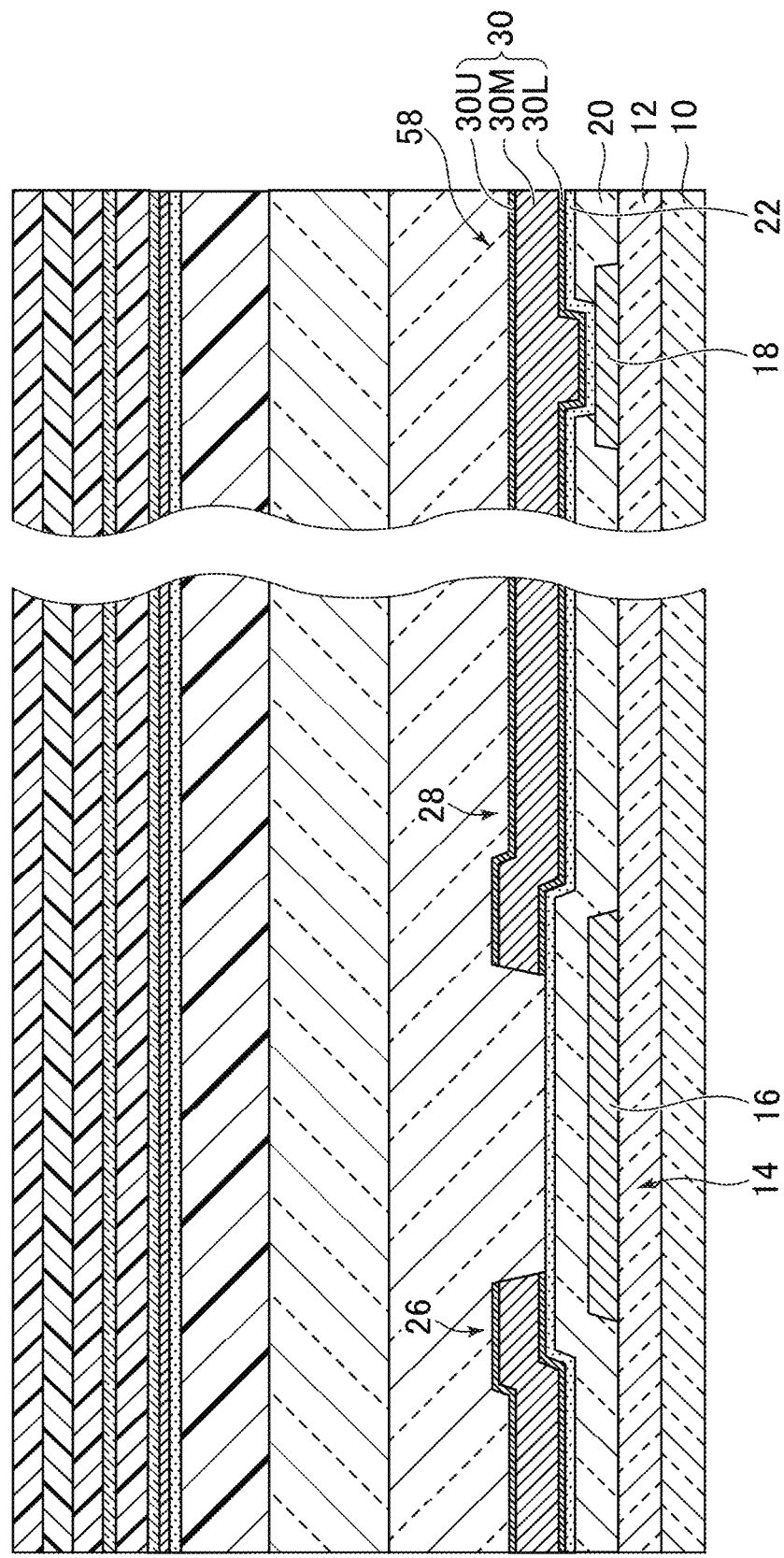
FIG. 6 is another longitudinal sectional view of the structure shown in FIG. 2.

FIG. 6 is another longitudinal sectional view of the structure shown in FIG. 2. The scan line 18, with which the gate electrode 16 is integrated, is connected to an interconnect line 58 included in the metal layer 30, outside the display area DA shown in FIG. 1. Although the oxide semiconductor layer 22 is interposed between the scan line 18 and the interconnect line 58, conductivity is ensured due to its thin film thickness of about 100 nm or less. Thus, it is possible to apply a voltage from the interconnect line 58 to the scan line 18 (gate electrode 16).

FIGS. 7 to 10 are diagrams of a manufacturing method of the display device according to the embodiment.

Figure 7:
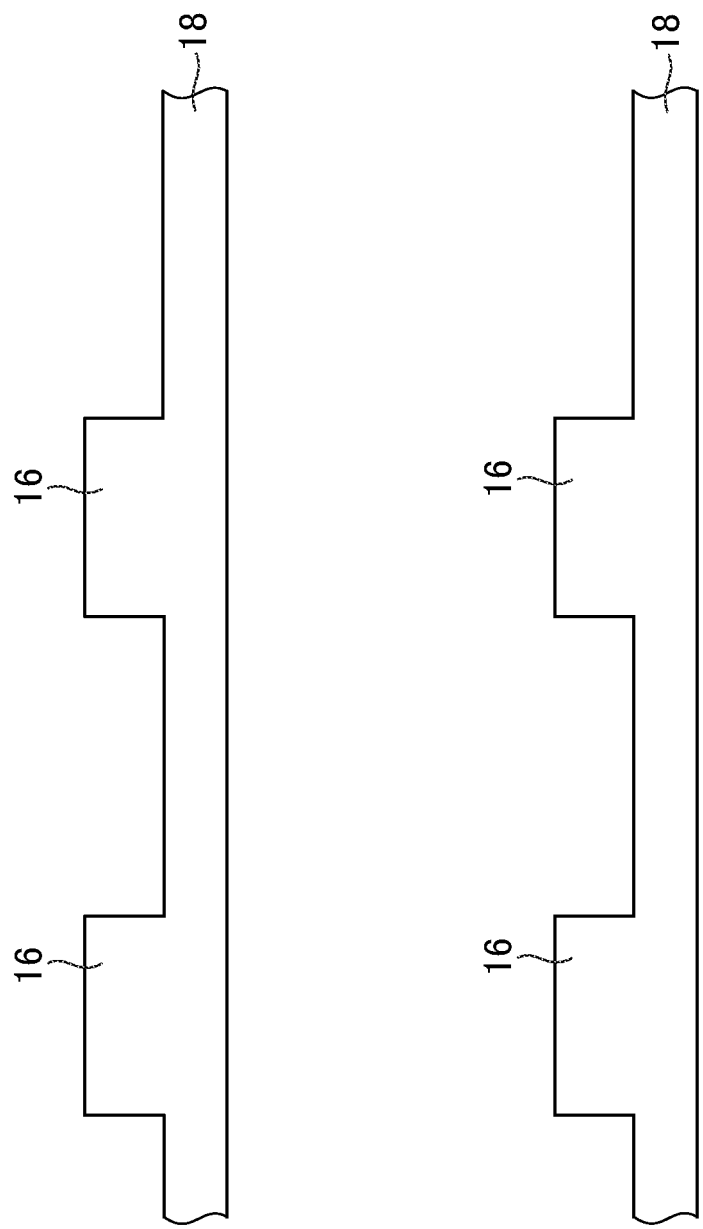
FIG. 7 is a diagram of a forming process of a plurality of gate electrodes.

As shown in FIG. 7, the plurality of gate electrodes 16 are formed. Each of the plurality of gate electrodes 16 is formed to be integrated with a corresponding one of the plurality of scan lines 18. The gate electrode 16 is shaped by fluorine-based dry etching. Then, the gate insulating layer 20 shown in FIGS. 4 to 6 (not shown in FIG. 7) is formed to cover the plurality of gate electrodes 16.

Figure 8:
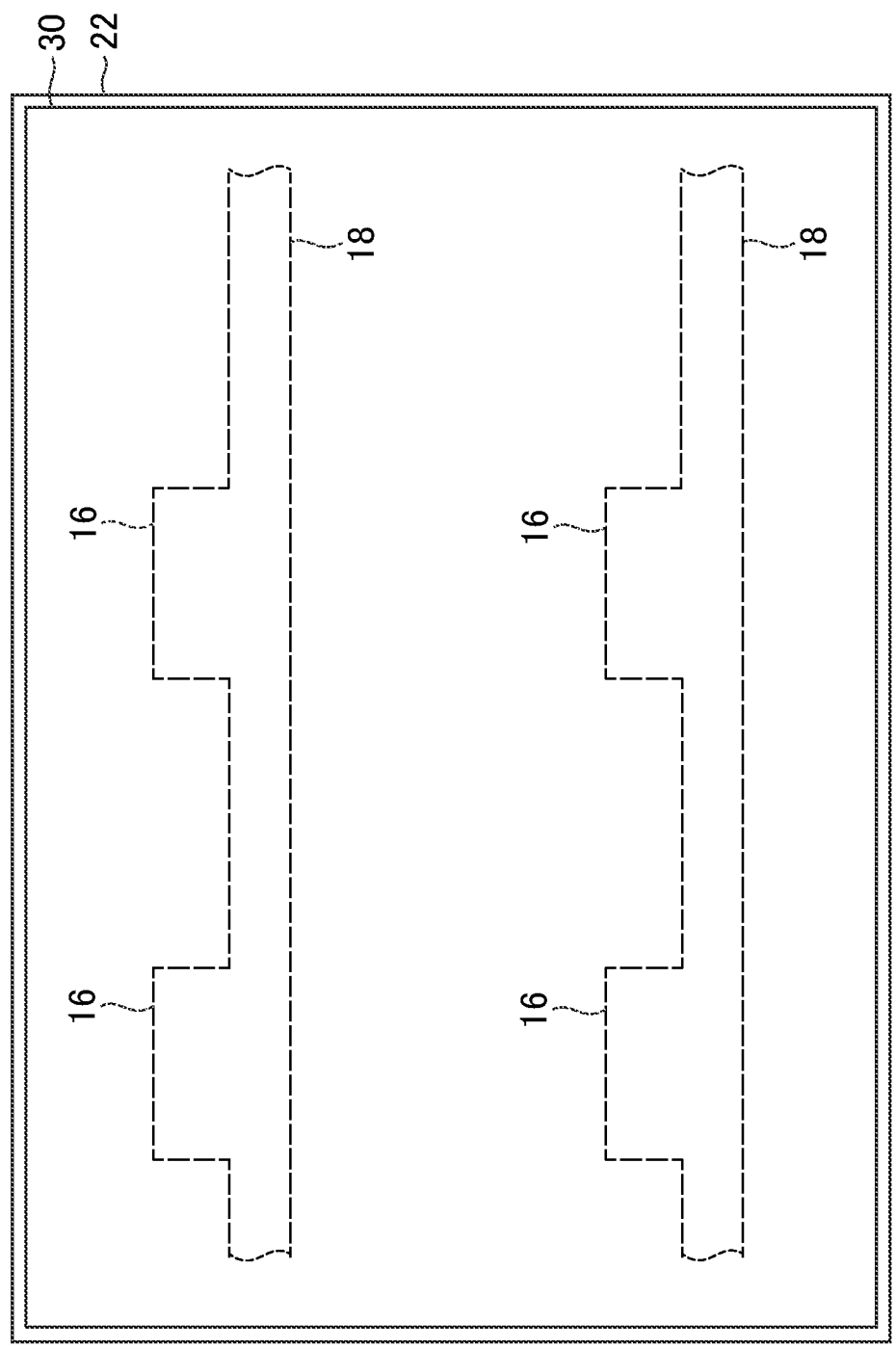
FIG. 8 is a diagram of a forming process of an oxide semiconductor layer.

As shown in FIG. 8, the oxide semiconductor layer 22 is formed. Then, the metal layer 30 is formed on the oxide semiconductor layer 22. The oxide semiconductor layer 22 and the metal layer 30 are formed over an entire surface of the substrate 10. The metal layer 30 is composed of the multiple layers, and the details thereof are as described above.

Figure 9:
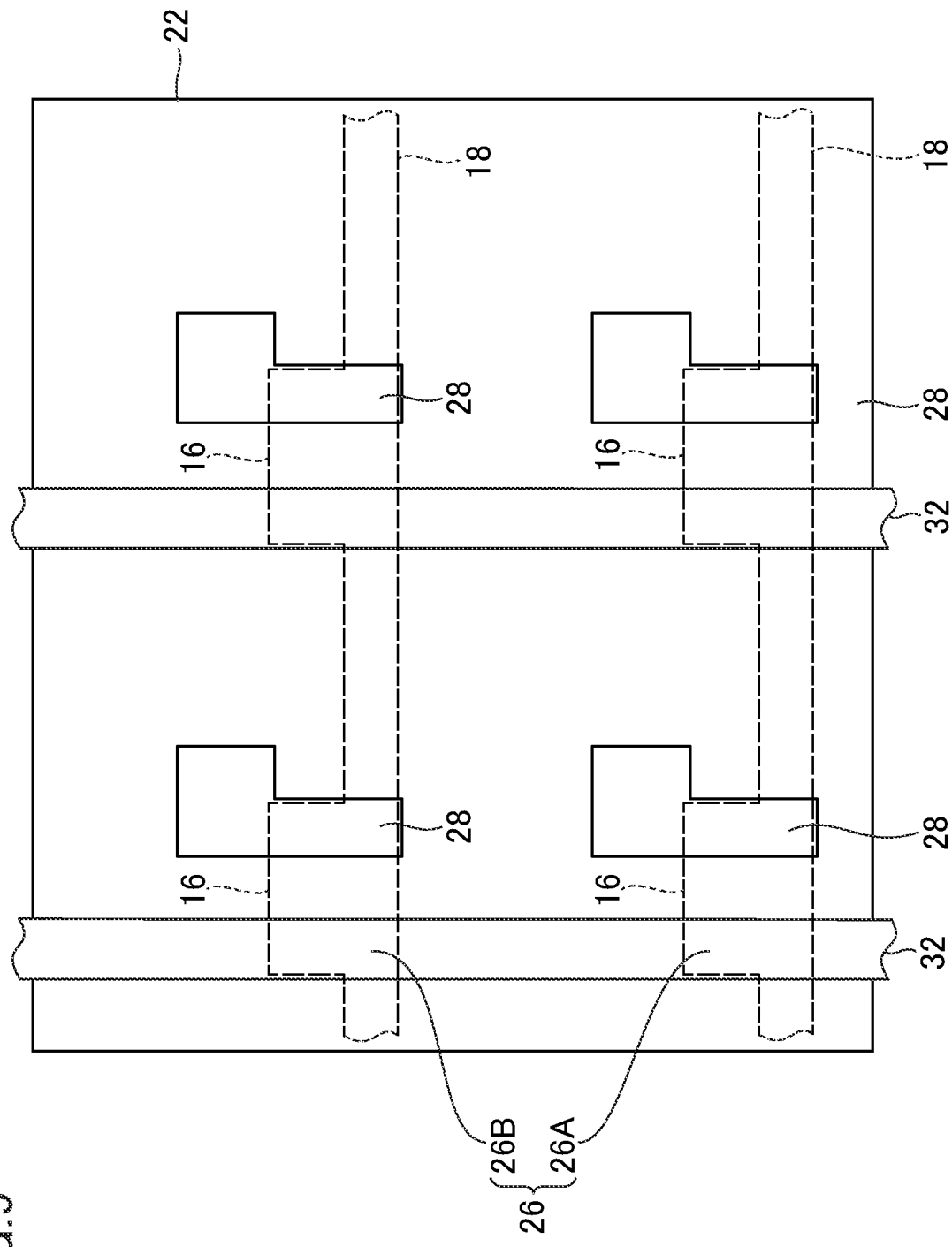
FIG. 9 is a diagram of a shaping process of a metal layer.

As shown in FIG. 9, the metal layer 30 is shaped. Specifically, the metal layer 30 is shaped into a form including the plurality of first electrodes 26 and the plurality of second electrodes 28. For the shaping, for example, chlorine-based gas is used. Each of the plurality of first electrodes 26 is formed to be integrated with a corresponding one of the plurality of video signal lines 32. The shaped metal layer 30 is continuous between the pair of first electrodes 26A, 26B included in the adjacent thin film transistors 14A, 14B (refer to FIG. 10).

Figure 10:
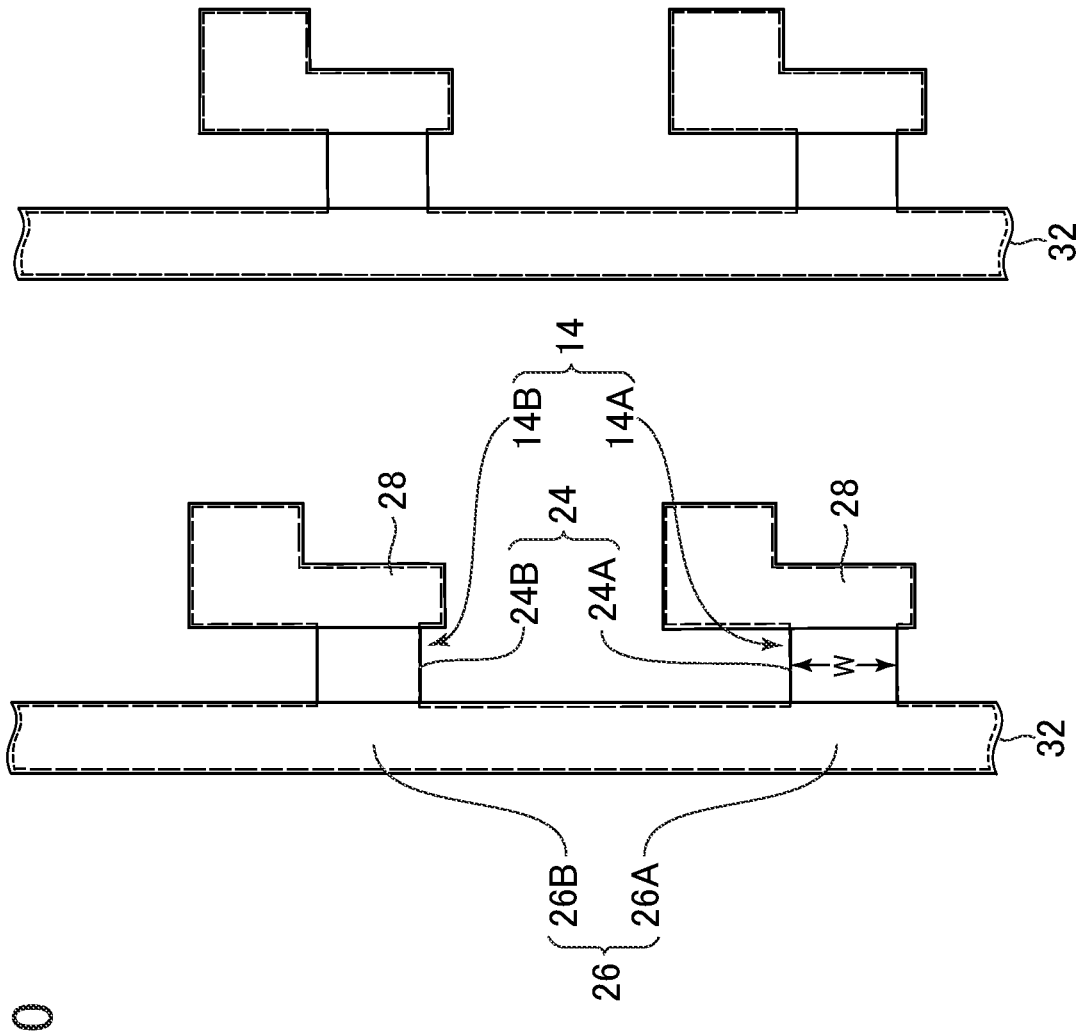
FIG. 10 is a diagram of a shaping process of the oxide semiconductor layer.

As shown in FIG. 10, after shaping the metal layer 30, the oxide semiconductor layer 22 is shaped. Specifically, the oxide semiconductor layer 22 is shaped into a form including the plurality of channel regions 24. For the shaping, an unillustrated etching mask is used, and for example, an etching solution containing oxalic acid is used. The oxide semiconductor layer 22 is continuous between the pair of channel regions 24A, 24B included in the adjacent pair of thin film transistors 14A, 14B, because the pre-shaped metal layer 30 also serves as an etching mask, during the shaping, in addition to the unillustrated etching mask described above.

Each of the plurality of channel regions 24 is between the corresponding one of the plurality of first electrodes 26 and the corresponding one of the plurality of second electrodes 28, constituting the corresponding one of the plurality of thin film transistors 14. Each of the plurality of thin film transistors 14 is formed to have a channel width W smaller than either of widths of the drain electrode and the source electrode.

According to the present embodiment, the oxide semiconductor layer 22 is continuous between the pair of channel regions 24A, 24B included in the adjacent pair of thin film transistors 14A, 14B. That is, under the metal layer 30, there is no end of the oxide semiconductor layer 22. Therefore, no break is formed in the metal layer 30, making it possible to suppress the characteristic change of the transistors.

FIG. 11 is a cross-sectional view of a display device according to a modification. While the above embodiment explained about the organic electroluminescent display device, the modification will describe a liquid crystal display device.

The liquid crystal display device is of a lateral electric field type. Therefore, both a pixel electrode 134 and a common electrode 144 are positioned below a liquid crystal layer 160.

The liquid crystal layer 160 is sandwiched between alignment films 162 above and below, and the pixel electrode 134 is positioned further below a lower alignment film 162. An insulating film 164 is interposed between the pixel electrode 134 and the common electrode 144. A protective film 166 is provided on the upper alignment film 162. Other contents are the same as those of the embodiment described above.

The present invention is not limited to the above-described embodiment, and various modifications can be made. For example, the configurations described in the embodiments can be replaced with substantially the same configuration, a configuration exhibiting the same operation and effect, or a configuration capable of achieving the same object.

What is claimed is:

1. A display device with a plurality of thin film transistors, comprising:
   a plurality of gate electrodes;
   a gate insulating layer covering the plurality of gate electrodes;

an oxide semiconductor layer on the gate insulating layer; and
a metal layer composed of multiple layers including a lowermost layer and a middle layer, the lowermost layer being lower in an ionization tendency than the middle layer, the lowermost layer being in contact with and on the oxide semiconductor layer,
wherein
the oxide semiconductor layer includes a plurality of channel regions,
the metal layer includes a plurality of first electrodes and a plurality of second electrodes,
each of the plurality of channel regions is interposed between a corresponding one of the plurality of first electrodes and a corresponding one of the plurality of second electrodes, constituting a corresponding one of the plurality of thin film transistors,
the oxide semiconductor layer is continuous between a pair of the plurality of channel regions included in an adjacent pair of the plurality of thin film transistors, and
the metal layer is continuous between a pair of the plurality of first electrodes included in the adjacent pair of the plurality of thin film transistors.

2. The display device according to claim 1, wherein
each of the plurality of gate electrodes is integrated with a corresponding one of a plurality of scan lines, and
each of the plurality of first electrodes is integrated with a corresponding one of a plurality of video signal lines.

3. The display device according to claim 1, wherein each of the plurality of second electrodes is connected to a corresponding one of a plurality of pixel electrodes.

4. The display device according to claim 1, wherein
an uppermost layer of the metal layer is made from the same material as the lowermost layer, and
the middle layer is interposed between the lowermost layer and the uppermost layer.

5. The display device according to claim 1, wherein
the lowermost layer includes titanium, and
the middle layer includes aluminum.

6. The display device according to claim 1, wherein each of the plurality of thin film transistors has a channel width smaller than either of widths of a drain electrode and a source electrode.

* * * * *